United States Patent [19]

Tapphorn

[11] 4,241,592
[45] Dec. 30, 1980

[54] CRYOSTAT FOR BOREHOLE SONDE EMPLOYING SEMICONDUCTOR DETECTOR

[75] Inventor: Ralph M. Tapphorn, Boulder, Colo.

[73] Assignee: Schlumberger Technology Corporation, New York, N.Y.

[21] Appl. No.: 838,886

[22] Filed: Oct. 3, 1977

[51] Int. Cl.² ............................................. F25B 19/00
[52] U.S. Cl. ................................... 62/514 R; 250/261
[58] Field of Search .................... 62/260, 514 R, 45; 165/45; 250/261

[56] References Cited

U.S. PATENT DOCUMENTS

| 2,711,084 | 6/1955 | Bergan | 62/514 R |
|---|---|---|---|
| 3,167,653 | 1/1965 | Rumble et al. | 250/261 |
| 3,176,473 | 4/1965 | Andonian | 62/514 R |
| 3,258,602 | 6/1966 | Promish | 62/514 R |
| 3,306,058 | 2/1967 | Keiln | 62/45 |
| 3,424,230 | 11/1969 | Wright, Jr. | 62/514 R |
| 3,443,632 | 5/1969 | Saurer | 62/514 R |
| 3,496,360 | 2/1970 | Dewan | 250/261 |
| 3,611,746 | 10/1971 | Marsing et al. | 62/514 R |
| 3,633,030 | 1/1972 | Antkiw et al. | 250/261 |
| 3,662,566 | 5/1972 | Brand | 62/514 R |
| 3,702,932 | 11/1972 | Tanner et al. | 62/514 R |
| 3,723,246 | 3/1973 | Lubin | 62/514 R |
| 3,762,175 | 10/1973 | Jones | 62/45 R |
| 3,807,188 | 4/1974 | Lagodmos | 62/514 R |
| 3,818,715 | 6/1974 | Scurlock | 62/514 R |
| 3,851,173 | 11/1974 | Taylor | 62/514 R |
| 3,851,274 | 11/1974 | Solin et al. | 62/514 R |
| 3,859,523 | 1/1975 | Wilson et al. | 250/261 |
| 3,894,403 | 7/1975 | Longsworth | 62/514 R |

FOREIGN PATENT DOCUMENTS 1046229 10/1966 United Kingdom .
1293401 10/1972 United Kingdom .
1310766 3/1973 United Kingdom .
1375434 11/1974 United Kingdom .
1472183 5/1977 United Kingdom .

OTHER PUBLICATIONS

Tanner et al., "A Probe for Neutron Activation Analysis in a Drill Hole Using $^{252}Cf$ & a Ge(Li) Detector Cooled by a Melting Cryogen", Nuclear Instruments & Methods 100, pp. 1–7, Apr. 1972.

Senftle et al., Intrinsic Germanium Detector Used in Borehole for Uranium Exploration, Nuclear Instruments & Methods 138, pp. 371–380, 1976.

Primary Examiner—Ronald C. Capossela
Attorney, Agent, or Firm—Brumbaugh, Graves, Donohue & Raymond

[57] ABSTRACT

In the specific embodiments of the invention disclosed, a semiconductor radiation detector located in a logging tool sized for passage through a borehole is maintained at cryogenic temperatures by a cryostat housed in the tool. The cryostat includes a cryogen chamber containing a melting-solid type cryogen. Thermal insulation in the form of radiation heat shields and a vacuum chamber surround the cryogen chamber. The integrity of the vacuum insulation is maintained by an active vacuum pump. The pump may be mounted either externally of the cryostat, such that its operation is independent of temperature conditions within the cryostat, or internally thereof, so as to be cooled by the cryogen. Alternatively, a second cryostat may be provided to cool the pump.

27 Claims, 12 Drawing Figures

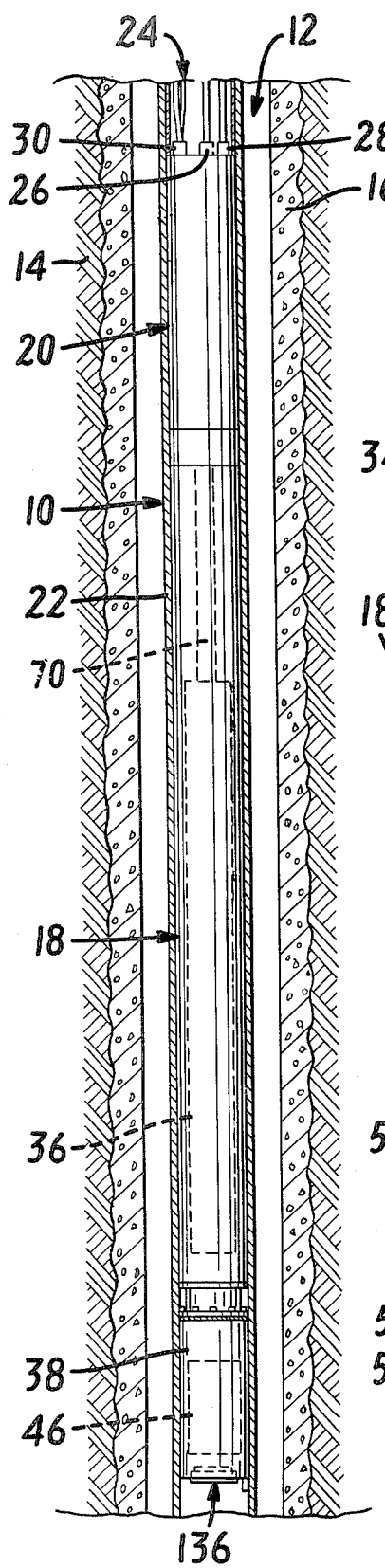
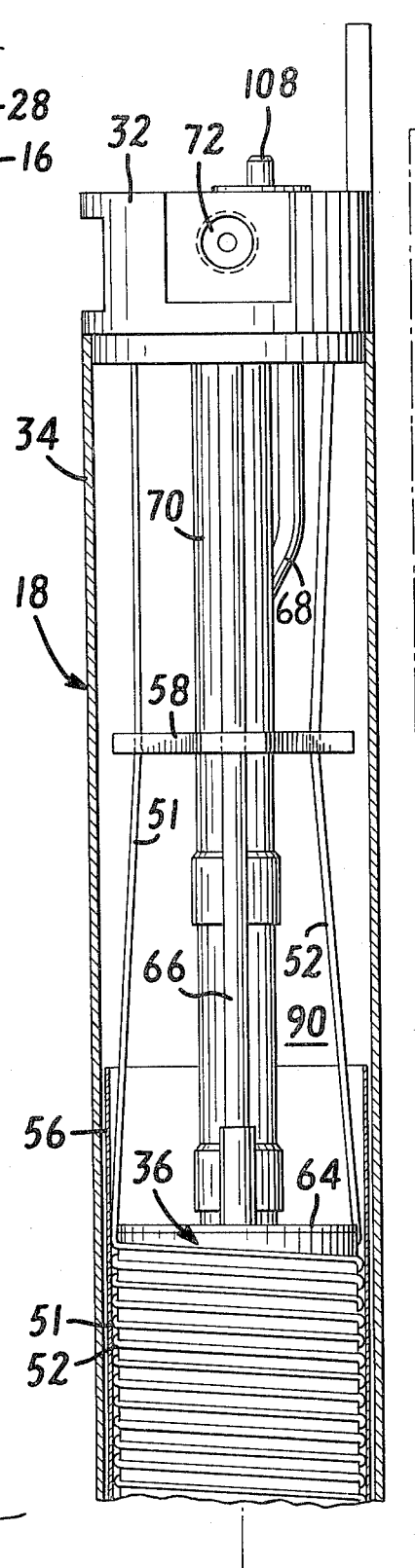
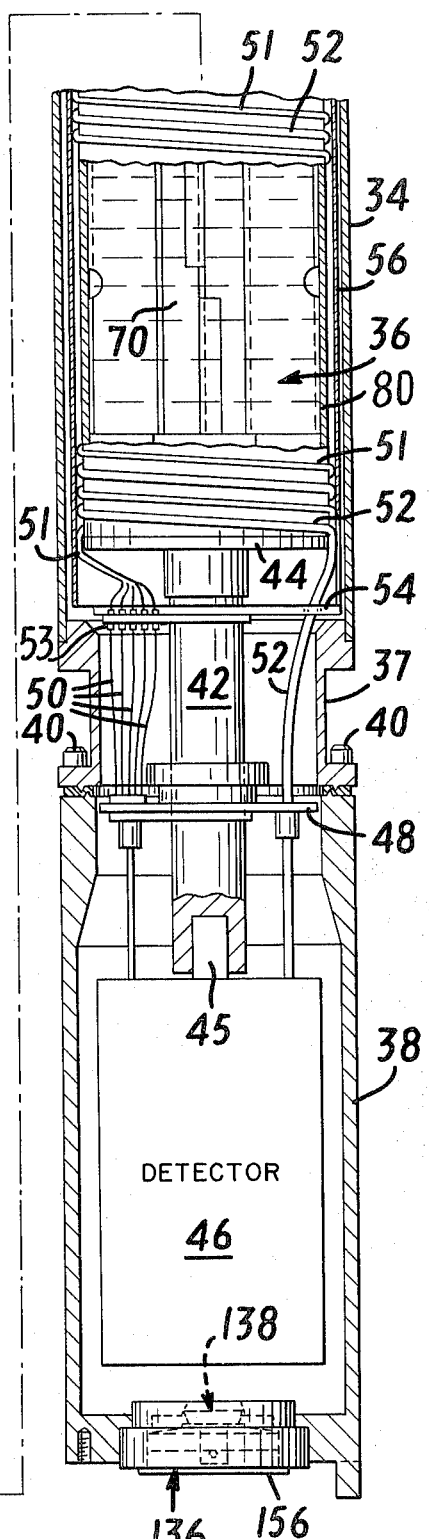
FIG. 1
FIG. 2

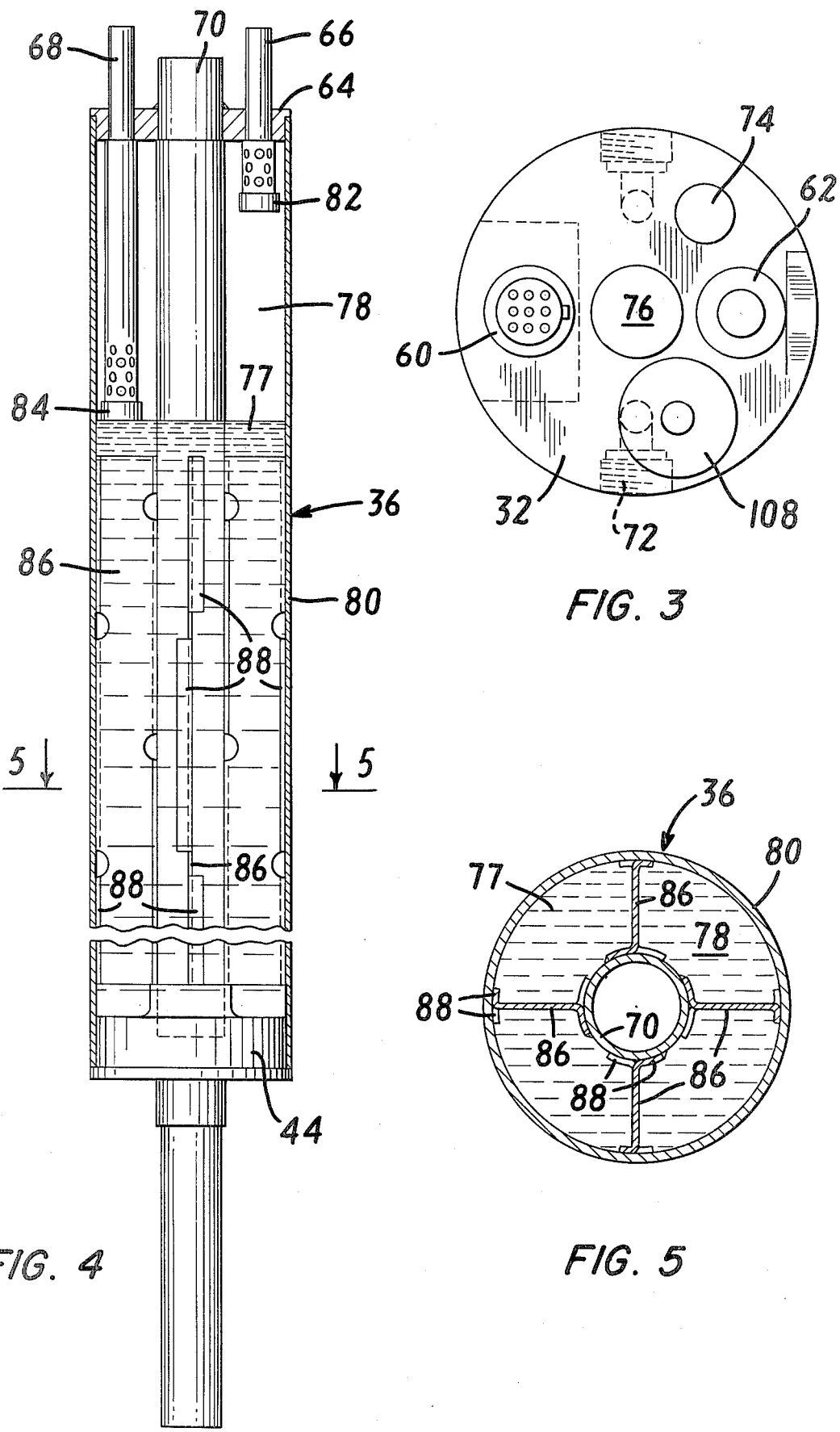

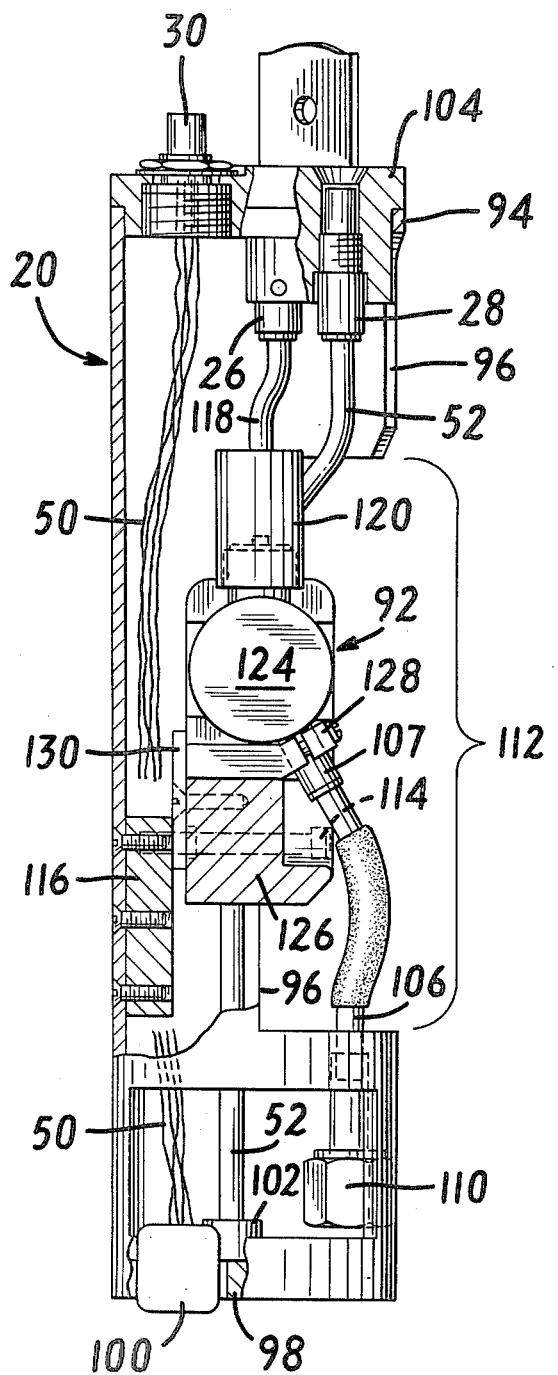
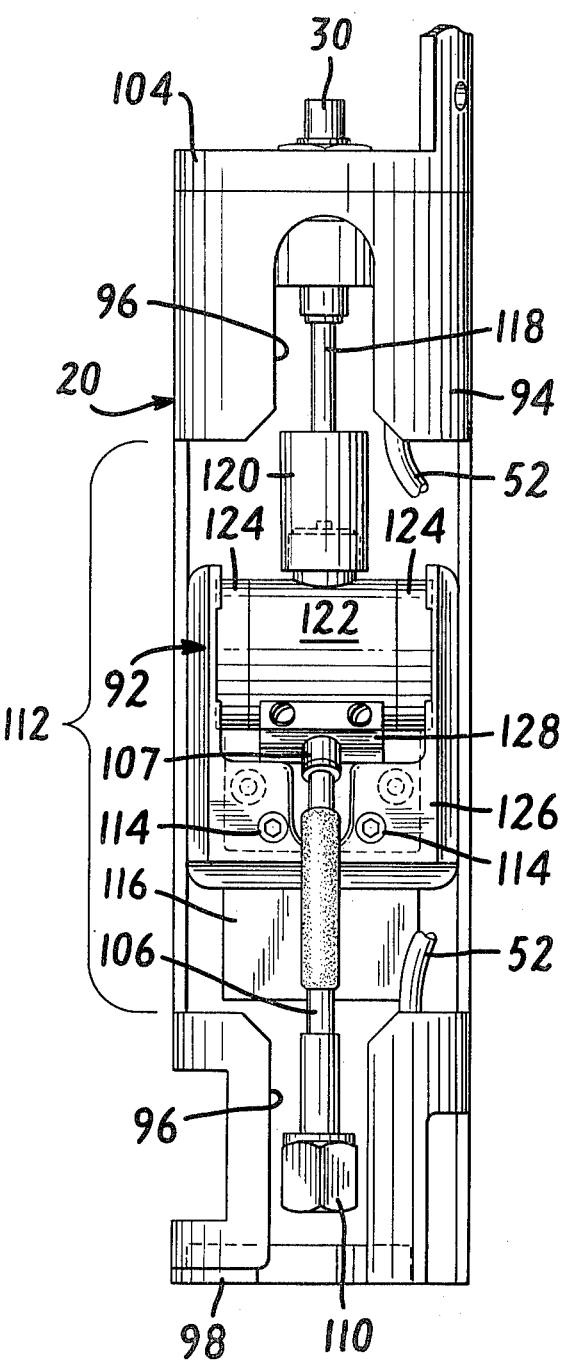
FIG. 6
FIG. 7

CRYOSTAT FOR BOREHOLE SONDE EMPLOYING SEMICONDUCTOR DETECTOR

BACKGROUND OF THE INVENTION

1. Field of the Invention

The present invention relates generally to borehole logging apparatus and, more particularly, to an improved borehole logging tool for detecting nuclear radiation by use of a cryogenically cooled semiconductor detector.

2. The Prior Art

In many instances, the exploration of subsurface earth formations for oil or the like is best achieved by gamma ray analysis. This, however, frequently requires the use of high resolution, semiconductor detectors, such as a high purity germanium (HPGe) detector or a lithium-drifted germanium (Ge(Li)) detector, which operate reliably only at cryogenic temperatures, e.g. on the order of $-180°$ C. The harsh ambient temperatures typically encountered in borehole logging, e.g., up to and above $200°$ C., have therefore been a serious obstacle to the utilization of semiconductor detectors in borehole exploration.

Good thermal insulation is essential for the proper operation of semiconductor detectors at elevated borehole temperatures. Size and other limitations inherent in borehole logging sondes, however, have hindered the provision and maintenance of good thermal insulation in a borehole environment. Consequently, prior art logging tools employing semiconductor detectors have had unduly short holding or operating times or have suffered from other deficiencies which have impaired their usefulness. Although these deficiencies of prior borehole devices have been largely overcome in the laboratory, the laboratory techniques utilized for this purpose, e.g. control of ambient temperatures by refrigeration, large-diameter cryostats, high volume vacuum pumps, are not applicable or cannot be readily adapted to use in a borehole sonde.

SUMMARY OF THE INVENTION

It is therefore an object of the invention to provide a borehole logging tool of the type incorporating a semiconductor radiation detector which overcomes the foregoing deficiencies of the prior art.

It is a further object of the invention to provide a borehole logging tool of the type referred to having a cryostat of improved construction which is productive of enhanced detector operating efficiency and operating lifetime.

It is still another object of the invention to provide a cryostat which is specially constructed for use within the space and temperature constraints of a borehole logging tool and which, at the same time, provides a substantially increased holding time for efficient semiconductor detector operation relative to prior art borehole devices.

The foregoing and other objects of the invention are accomplished by the provision of a borehole logging tool having an elongated housing sized for passage through a borehole, a cryostat within the housing and including an interior cryogen chamber and a surrounding vacuum insulation chamber, a semiconductor detector mounted within the housing in good thermal contact with the cryogenic material, and an active vacuum pump, preferably of the ion pump type, coupled to the vacuum insulation chamber. In a preferred embodiment, the vacuum pump is mounted externally of the cryostat such that its operation is independent of temperature conditions within the cryostat. If cooling of the pump is desired to minimize outgassing, it may be mounted within the cryostat and connected to the cryogen by a cold finger or, alternatively, a second cryostat could be provided to cool the pump. The vacuum pump is adapted to maintain the vacuum pressure within the vacuum insulation chamber at a desired level, preferably at $10^{-4}$ Torr. or less, so as to preserve the integrity of the vacuum insulation blanket surrounding the cryogen chamber and thereby prolong the effective operating time of the detector. Advantageously, the cryogenic material employed is a melting-solid type cryogen such as Freon 22.

Whereas it is known that outgassing and ion sputtering from an ion pump operated in close proximity to a semiconductor detector is permanently detrimental to the detector in a preferred embodiment the ion pump is mounted at the head of the cryostat such that both the distance to the detector and the narrow passage along the cold cryogen chamber wall provides an effective trapping mechanism for these ions.

In addition to the vacuum insulation chamber, high reflectivity thermal radiation shielding is mounted around the cryogen chamber to further insulate against heat loss. Vacuum degradation is minimized by the use of all metal-to-metal seals across the vacuum chamber. Structure is also provided within the cryogen chamber for increasing efficiency and enhancing the safety of the device. This includes the provision of double fill and vent tubes for introducing the cryogenic material into the cryogen chamber in a way which provides a desired vapor volume for expansion of the cryogen. Radial vanes composed of thermally conductive material extend lengthwise of the cryogen chamber for the purpose of speeding freezing of the cryogenic material and for promoting temperature uniformity within the chamber, thereby tending to eliminate the formation of localized high pressure points.

Where a melting-solid type cryogen is used, a central tube for introduction of a freezing agent, e.g. liquid nitrogen ($LN_2$), is provided lengthwise of the cryostat for purposes of freezing the cryogenic material within the cryogen chamber.

In accordance with a feature of the invention, the active vacuum pump may be mounted externally of the cryostat and immediately adjacent the end wall of the cryostat through which the freezing-agent tube extends. So located, the pump is preferably flexibly mounted to the cryostat such that it may be moved aside to permit introduction of the agent into the tube without necessitating uncoupling of the vacuum pump from the vacuum chamber of the cryostat. This facilitates maintenance of the vacuum pressure within the vacuum insulation chamber while at the same time permitting freezing or refreezing of the cryogen.

BRIEF DESCRIPTION OF THE DRAWINGS

For a better understanding of the invention, reference may be made to the following description of an exemplary embodiment thereof, taken in conjunction with the figures of the accompanying drawings which:

FIG. 1 is a partial vertical sectional view of a borehole logging tool constructed in accordance with the invention;

FIG. 2 is a vertical sectional view of the cryostat of the tool of FIG. 1, showing the semiconductor detector mounted therein;

FIG. 3 is a top view of the cryostat of FIG. 2;

FIG. 4 is a vertical sectional view of the cryogen chamber of the cryostat of FIG. 2, showing the fill and vent tubes for introduction of the cryogenic material into the chamber and also showing the thermal conductor vanes within the chamber;

FIG. 5 is a horizontal sectional view of the cryogen chamber, taken along the line 5—5 of FIG. 4 and looking in the direction of the arrows;

FIG. 6 is a vertical sectional view of the ion pump extension of FIG. 1;

FIG. 7 is a side view of the ion pump extension;

DETAILED DESCRIPTION

Figure 8:
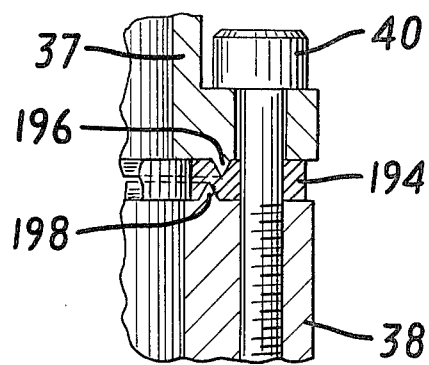
FIG. 8 is a detail view showing the structure of the metal-to-metal seal established between the lower head of the cryostat and the detector housing.

For purposes of illustration, representative embodiments of the invention are described herein by reference to oil well borehole exploration and the requirements in respect of performance and physical characteristics imposed thereby on a semiconductor-detector tool. It will be understood, however, that the invention has application to other uses and environments, and particularly to uses and environments where high temperature ambients exist and/or where space limitations are critical.

In oil well exploration, borehole temperatures frequently exceed 100° C. and sometimes range upwards of 200° C. Because of the great depths involved, it is sometimes necessary to operate a tool at such temperatures for extended periods. In accordance with the invention, therefore, the preferred minimum holding time for an oil well semiconductor-detector tool is six hours at an ambient temperature of 125° C. In the case of an HPGe or Ge(Li) solid-state gamma ray detector, for example, the operating temperature should be at or below −160° C. through this entire period. For a melting-solid type cryogen, holding time as herein used is defined as the time required for the temperature of the detector to rise from its initial temperature to a temperature 5° C. above the melting point of the cryogen. Desirably, the tool should also be capable of withstanding ambient temperatures of 200°0 C. for shorter periods, e.g., one to two hours. Moreover, the overall dimensions of the tool must be compatible with existing oil well borehole sizes. In particular, the outer diameter of the cryostat package should not exceed three inches so as to be usable in smaller-sized boreholes.

In FIG. 1, a representative embodiment of a borehole logging tool 10 constructed in accordance with the invention is shown suspended in an oil well borehole 12 traversing an earth formation 14 to be explored. The borehole 12 is shown as a cased hole, having a cement annulus 16 formed therein, but it will be understood that the logging tool 10 could be used as well in an open hole. Although not shown, the usual logging cable is provided to suspend the tool 10 in the borehole and to establish electrical connection with the surface.

In the embodiment of FIG. 1, the tool 10 includes a cryostat 18 and a vacuum pump extension 20 enclosed within a pressure housing 22. An electronics section 24 is located above the vaccum pump extension 20, and will be understood to contain the high-voltage power supplies for the detector and vacuum pump as well as the circuits required to process and relay the detector signals to the surface. High voltage connections with the electronics section 24 are shown schematically in FIG. 1 at 26, for the vacuum pump extension, and at 28, for the detector bias. The connection between the electronics section 24 and the detector lead wires is shown at 30. Any suitable electrical receptacles may be employed for these connections.

The logging tool 10 may be used to detect natural or artificial gamma rays emanating from the formation 14. Where natural gamma rays are to be detected, the pressure housing 22 may simply be completed below the cryostat 18 with a conventional bullnose or endcap. Alternatively, where artificial gamma rays are to be detected, a neutron source would be mounted within the pressure housing below (or above if desired) the cryostat. Suitable spacers and neutron shielding may of course be provided between the source and the cryostat.

As shown in more detail in FIG. 2, the cryostat 18 includes an upper head 32, an outer housing 34, a cryogen chamber 36 mounted within and spaced from the outer housing 34, a lower head 37 and an end cap or detector housing 38 removably attached by bolts 40 to the lower head 37. A cold finger 42, constructed of copper or other thermally conductive material, is welded or silver-soldered in good thermal contact with the lower end cap 44 of the cryogen chamber 36. The cold finger 42 has a split clamp or other suitable mounting mechanism (not shown) at its lower end for accepting the mounting stud 45 of a semiconductor detector 46. The detector 46 may comprise any suitable solid state gamma-ray detector, such as an HPGe or Ge(Li) detector. As shown in FIG. 2, the length of the cold finger 42 is such that the detector 46 is spaced both from the side and end walls of the detector housing 38. The detector electronics comprise a filter network for the high voltage bias and a cooled FET for coupling to the detector, and preferably are installed on a printed circuit component card 48 which is mounted on the cold finger 42. Conventional electronics are known and available for this purpose and they are therefore not shown in detail herein. Low outgassing materials should be used for the component card 48. Although not shown in FIG. 2, a suitable temperature sensor, such as a forward-biased silicon diode, is preferably provided on the cold finger 42 or attached directly to the detector 46.

The detector signal lead wires 50 extending from the component card 48 are attached to terminal connectors 53 on the underside of a lower lead support 54 composed of Teflon or other suitable insulating material. Rigid copper rods are preferably used for the terminal connectors to reduce microphonics in the event of vibration. Above the lower lead support 54, the lead wires 50 are preferably twisted into one or more bundles 51 and then wrapped tightly around the cryogen chamber 36, as shown in FIG. 2, to further reduce microphonics. The high voltage bias lead wire 52 from the detector extends upward through the lower lead support 54 and may likewise be wrapped around the cryogen chamber. As is described more fully hereinafter, a radiation heat shield 56 is fitted over the wire-wrapped chamber 36.

The lead wire bundle 51 and lead wire 52 are supported above the cryogen chamber 36 by an upper lead support 58, also constructed of Teflon or other insulating material. Upwards of the upper lead support 58, the lead wires 50 and 52 terminate in electrical connectors 60 and 62, respectively, located in the upper head 32 of the cryostat (see FIG. 3). Connectors 60 and 62 are preferably silver-soldered to the upper head 32 in an inert atmosphere to reduce outgassing. Suitable connectors for this purpose are the Deutsch Model DM5600-7 connector, for the detector lead wire connector 60, and the Ceramaseal Model 800/A0/208-1 connector, for the high voltage connector 62.

Referring now to FIGS. 2 and 4, the upper end cap 64 of the cryogen chamber 36 is pierced by three stainless steel tubes, a cryogen fill tube 66, a cryogen vent tube 68 and a centrally located access tube 70 for admitting a freezing agent to the cryogen chamber to solidify the cryogen and to cool the detector. If desired, the center tube 70 may be constructed in sections, as shown in FIG. 2, to facilitate assembly of the cryostat. The joints between the tubes 66, 68 and 70 and the upper end cap 64, like all other joints in the cryogen chamber, are preferably welded or silver-soldered. The fill tube 66 and vent tube 68 terminate in external ports 72 and 74, respectively, in the upper head 32 of the cryostat (see FIG. 3), and are plugged with vacuum seal pressure relief valves having suitably low pressure relief thresholds, e.g. 2 psi. These valves serve to bleedoff any significant pressure buildup within the cryogen chamber and also, by virtue of their low threshold setting, to prevent icing at the ends of the fill and vent tubes. Access tube 70 terminates in head 32 in a port 76. Where a completely sealed, non-venting cryogen chamber is used, a high threshold (300 psi) pressure relief valve would be provided to prevent catastrophic pressure build-up within the chamber.

As mentioned, the center tube 70 and its external port 76 in the upper head 32 provides access for the introduction of a freezing agent, such as liquid nitrogen ($LN_2$) or the cold finger of a mechanical refrigerator, for the purpose of freezing the cryogenic material in the cryogen chamber 36. Preferably the cryogenic material used is a melting-solid type cryogen, such as Freon 22. In this case, the cryogen is loaded into the cryogen chamber 36 through the fill and vent tubes 66 and 68 and is frozen therein by the freezing agent present in the center tube 70. It will be understood that Freon 22 is merely exemplary of melting-solid type cryogenic materials and that generally any cryogenic material of appropriate properties might be used. Desirably, the cryogenic material should be non-flammable and, for a HPGe or Ge(Li) detector, have a melting point below or equal to $-160°$ C.

Referring now to FIGS. 4 and 5, it may be seen that the cryogen 77 is stored in the annulus 78 between the shell 80 of the cryogen chamber and the central access tube 70, which extends the length of the cryogen chamber and is attached in good thermal contact with the lower end cap 44 thereof. The fill tube 66 extends into the annulus 78 and is covered at its inner end with a perforated cap 82. The vent tube 68 likewise extends into the annulus 78 and is covered at its inner end by perforated cap 84. The end caps 82 and 84 are preferably formed with a plurality of holes, such as a mesh screen for example, to reduce the likelihood of foreign material blocking the tubes.

In accordance with the invention, the vent tube 68 extends farther into the cryogen chamber 36 than does the fill tube 66 so as to provide a vapor volume for expansion of the cryogenic material and thereby prevent overfill of the chamber. In the case of a melting-solid type cryogen, e.g. Freon 22, the vapor volume should be large enough to permit expansion of the cryogen through a temperature variation from its frozen temperature, e.g., $-196°$ C. for $LN_2$ as the freezing agent, to its boiling point, e.g., $-40.8°$ C. for Freon-22, at which time the pressure relief valve or valves should be activated. If the cryogen is permitted to vent to the atmosphere, the vapor volume required is less than where the cryogen is wholly sealed within the chamber 36. The former case is illustrated in FIG. 4, and it will be understood, therefore, that the vent tube 68 would extend farther into the cryogen chamber 36 if the chamber were sealed to the atmosphere than it does in FIG. 4. For example, the preferred minimum vapor volume for a vented cryogen chamber of the type shown in FIG. 4 is approximately 15% of the volume of the cryogen chamber. For a sealed cryogen chamber, however, the preferred minimum vapor volume is approximately 40%. These comparative volumes assume that the cryogen is Freon-22 and provide for expansion of the liquid Freon-22 over a temperature range from its melting point to a temperature of approximately 55° C. The use of different length cryogen fill and vent tubes 66 and 68 may be seen, therefore, to provide two important advantages: (1) it facilitates proper loading of the cryogen into the cryogen chamber 36 by virtue of providing a separate tube for filling and a separate tube for venting the cryogen, and (2) it provides a simple, yet expeditious, way of implementing the provision of the necessary safety vapor volume within the cryogen chamber.

In loading the cryogen chamber 36, the $LN_2$ or refrigerator probe is first introduced into the access tube 70. The cryogenic material in liquid form is then injected through the port 72 and fill tube 66 with the chamber stood upright until the cryogen begins to flow out of the vent tube 68. Thereafter, the cryogen chamber is preferably purged with a gas, such as helium, that is noncondensible at the temperature of the freezing agent ($-196°$ C. for $LN_2$), to force out all of the cryogen above the level of the inner end of the vent tube 68. The volume within the annulus 78 between the level of the end cap 84 of the vent tube 68 and the upper head 64 of the cryogen chamber will thus constitute a safety vapor volume for expansion of the cryogen with temperature. The size of the vapor volume provided may of course be varied by adjustment of the length of the vent tube 68. It will likewise be appreciated that the fill tube 66 may also function as a vent tube during use of the cryostat. Thereafter the purge gas is evacuated and the cryogen chamber sealed. Finally, the access tube 70 is filled with low thermal conductivity plastic foam to minimize convection currents and associated heat losses.

As a further safety feature in accordance with the invention, the cryogen chamber 36 includes a plurality of fins or vanes 86 which, as shown in FIGS. 4 and 5, extend radially from the center column 70 to the shell 80 of the cryogen chamber and lengthwise of the chamber over substantially the full portion thereof occupied by the cryogen while in the liquid or frozen state. The fins 86 are made of a highly thermal-conductive material, such as copper, and are welded or silver-soldered at the inner end to the tube 70. Alternate tabs 88 may be formed at the inner and outer ends of the fins 86 to facilitate assembly of the fins between the tube 70 and the chamber shell 80. The fins 86 promote freezing of the cryogen by establishing good thermal contact between the freezing agent within the column 70 and the cryogenic material within the annulus 78 of the cryogen chamber. They also promote temperature uniformity lengthwise of the cryogen chamber during use of the tool. This tends to prevent the formation of high pressure points within the chamber 36 due to localized melting or vaporization of the frozen cryogen.

The shell 80 of the cryogen chamber 36 is preferably constructed of oxygen-free high conductivity copper. To reduce radiation heat loss, all surfaces of the cryogen chamber should be thoroughly cleaned and polished. The outer surface of the shell 80 is preferably coated with a highly thermal reflective material, such as gold, and polished to a high luster. The inner surface of the cryostat housing 34 should likewise be thoroughly cleaned and highly polished. If desired, it too may be gold plated. As mentioned above, and as shown in FIG. 2, further insulation against radiation heat loss is provided by positioning one or more radiation heat shields 56 in surrounding relation to the cryogen chamber 36. Shield 56 is preferably constructed of gold-plated, stainless stell sheet and extends the full length of the cryogen chamber. Shield 56, as shown in FIG. 2, is supported concentrically around the cryogen chamber by fitting over the wrapped wires 51 and 52 and is supported longitudinally by the lower head support 54. Other suitable low-thermal conductivity supports may also be used. If more than one radiation shield is provided, each shield should be thermally isolated from the other shields by low thermal conductivity supports. Sufficient space should be left between adjacent shields to facilitate rapid evacuation of the air from the chamber 90 formed between the outer housing 34 of the cryostat and the shell 80 of the cryogen chamber 36.

According to the invention, the chamber 90 is evacuated and maintained at a vacuum to provide a desired degree of thermal insulation against heat loss due to convection and conduction. Desirably, the vacuum pressure within chamber 90 is maintained at or below $10^{-4}$ Torr. to provide the maximum thermal insulation. For a borehole logging tool, it is desirable that such vacuum pressure be maintained over a relatively prolonged period, e.g. 8–12 hours, even though the tool is subject to comparatively high ambient borehole temperatures, e.g. on the order of 125° C. It is also advantageous in a borehole logging tool that provision be made for convenient recovery of any vacuum degradation above $10^{-4}$ Torr., so as to permit repeated operation of the tool in a high temperature (125°–200° C.) borehole. This latter feature of the invention is described hereinafter in connection with FIGS. 9 and 10.

In accordance with the invention, the vacuum pressure within chamber 90 is maintained at the desired level by the provision of an active vacuum pump which, in the embodiment of FIG. 1, is mounted externally of the cryostat in the vacuum pump extension 20. For economy of space and electrical power requirements, an ion pump is preferably employed in logging tool 10 as the vacuum pump. In applications where space and power requirements are not so critical, other types of active vacuum pumps, such as a turbomolecular pump, may be used. Passive pumps, e.g. a molecular sieve pump, are generally incapable of sustaining vacuum pressures of the desired level in a borehole environment, and it is therefore a feature of the invention that an active vacuum pump is employed.

One embodiment of the vacuum pump extension is illustrated in FIGS. 6 and 7. As there shown, the vacuum extension 20 includes a provision for flexibly mounting the ion pump 92 on the extension so as to permit ready access to the external port 76 (FIG. 3) of the center tube 70 for introduction of the $LN_2$ or refrigerator probe into the cryostat. To that end, the ion pump extension comprises a generally cylindrical housing 94 having a lengthwise slot 96 formed therein. Slot 96 extends upward from the lower end cap 98 of the ion pump extension over substantially the full length of the housing 94. The lower end cap 98 carries suitable connections for attachment to the upper head 32 of the cryostat 18. These include complementary electrical receptacles 100 and 102 (see FIG. 6) for mating with the detector lead wire connector 60 and the detector high voltage bias wire connector 62, respectively, on the cryostat upper head 32. Receptacles 100 and 102 are omitted from FIG. 7 for clarity.

The detector lead wires 50 extend from the receptacle 100 to the connector 30 located in the upper head 104 of the ion extension and the high voltage bias wire 62 extends from the receptacle 102 to the connector 28 in the upper head. The lower head 98 is formed with a cutaway (not shown) to permit coupling of a stainless steel flexible tube 106 leading from vacuum inlet 107 of the ion pump 92 to a connection adaptor 108 attached, preferably by silver-soldering, to the cryostat head 32. (FIG. 3) The connection of tube 106 to the adaptor 108 is preferably made by use of a gland-type copper vacuum seal connector 110. Suitable connectors of this type are available from the Cajon Company, Cleveland, Ohio.

The flexible tube 106 and connector 110 are preferably located closely adjacent the slot 96 in the housing 94 to facilitate assembly of the ion pump extension 20 to the cryostat 18. Also, as is shown in FIG. 7, the slot 96 is widened over a central region 112 of the ion extension housing 94 to permit withdrawal of the ion pump 92 from the housing whenever it is desirable to introduce the $LN_2$ or refrigerator probe into the cryostat to freeze the cryogen. To that end, the ion pump 92 is detachably mounted, as by bolts 114 (FIG. 7), to a bracket 116 (FIG. 6) bolted to the pump extension housing 94. Thus, the ion pump 92 may be readily pivoted out of the housing 94 simply by removing the two bolts 114 and detaching the high voltage lead 118 from the pump 92. The lead 118 connects through the connector 26 to the high voltage power supply for the ion pump located in the electronics section 24 of the logging tool 10. The lead connection to the pump 92 is preferably a contact electrode molded in an insulating plug 120 so as to be removable from the pump.

Any ion pump of suitable construction may be employed. For example, the two liter/second Model T17 ion pump manufactured by Varian, Vacuum Division, Palo Alto, California, may be used. This pump is illustrated in FIG. 7 at 122. A samarium-cobalt disc magnet 124 is located at either end of the iron pump 122, and these magnets are also available from Varian. The magnets 124 are mounted within a U-shaped mild steel yoke 126 and, when so mounted, preferably provide a minimum field strength of 1200 Gauss in the center of a 1½" pole gap at an ambient temperature of 150° C. A dog-leg bracket 128 is attached at one end to a plate 130 carried by the yoke 126 and at the other end clamps around the vacuum inlet 107 of the vacuum pump to hold the pump in position relative to the yoke 126.

Although the ion pump 92 is shown in FIGS. 6 and 7 as attached to the cryostat head 32 by means of the flexible stainless tube 106, it will be understood that if some other technique is used to introduce the liquid nitrogen or refrigerator probe into the tube 70 for freezing the cryogen, the pump 92 could be rigidly mounted to the cryostat head. By use of an externally mounted ion pump as described above, it is possible to obtain a substantial increase in the cryostat holding time relative to that which is realizable without the use of the vacuum pump.

Figure 9:
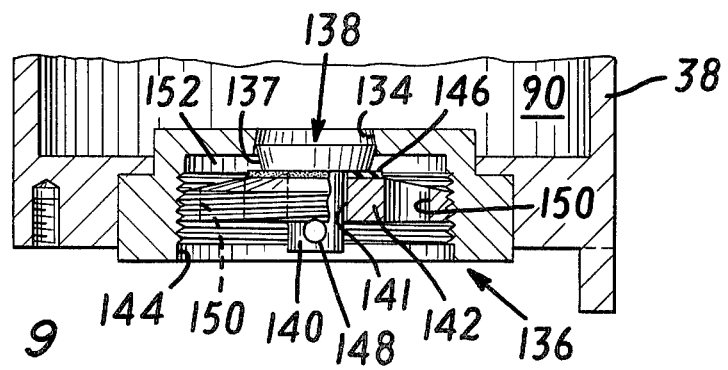
FIG. 9 is a detail view of the vacuum seal assembly located at the lower end of the cryostat outer housing.

It is also desirable, as aforesaid, to provide for rapid recovery of any vacuum degradation in chamber 90 which results from high borehole temperatures. To that end, a pump-out port 134 (FIG. 9) closed by a vacuum seal assembly 136 is provided in the lower end wall of the detector housing 38 (FIG. 2). As shown in FIG. 9, the pump-out port 134 tapers inwardly and coacts to establish a vacuum tight seal with the outwardly tapering head 137 of a valve member 138. The valve member 138, which is preferably copper, includes a stem 140 integral with the valve head 137. The stem 140 passes through a central bore 141 in a disc 142 which is threaded within a counter bore 144 in the end wall of the housing 38. The disc 142 is captured between a Teflon washer 146 adjacent the valve head 137 and a pin 148 extending transversely through the valve stem 140. A series of axial holes 150 are formed through the disc 142 outward of the central bore receiving the valve stem 140. These holes communicate with the annular space 152 inwardly of the disc 142 and, when the valve head 137 is moved away from the port 134, with the internal chamber 90 of the cryostat. A dust cover 156 (see FIG. 2) threads within the bore 144 and closes off the valve assembly 136 when it is not in use.

Figure 10:
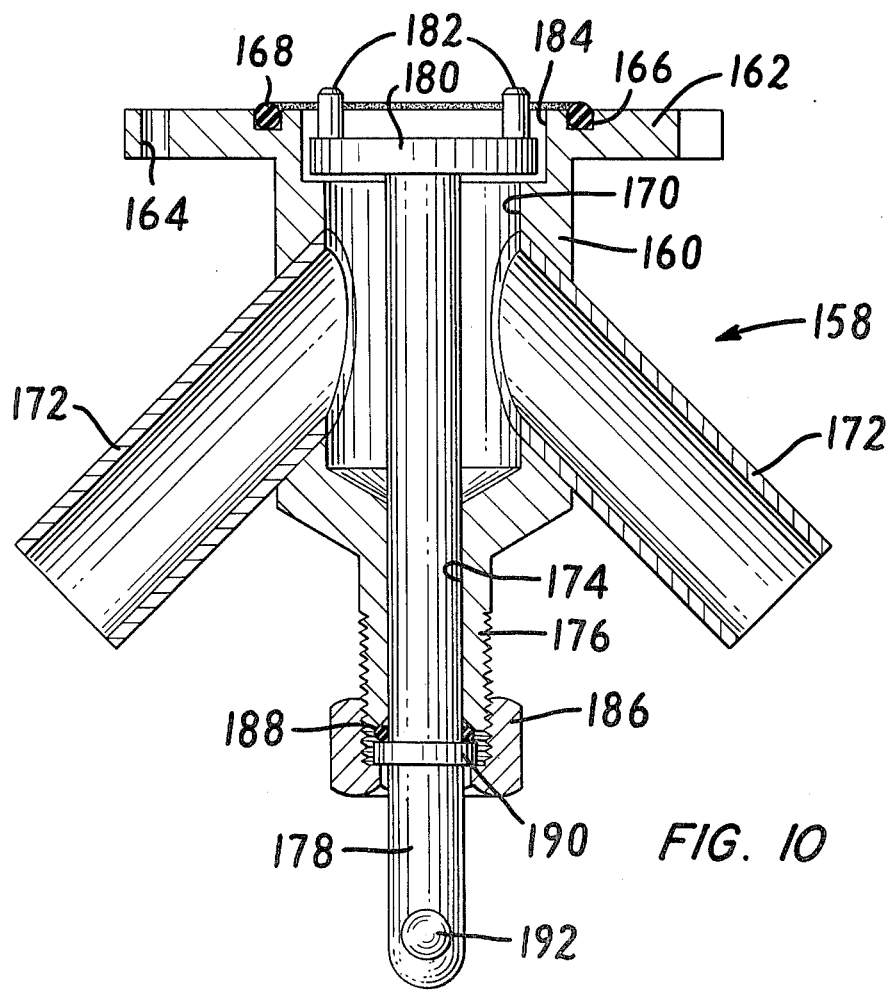
FIG. 10 is a sectional view of a pump-out valve manifold assembly for use in evacuating the vacuum chamber of the cryostat through the vacuum seal assembly of FIG. 9.

FIG. 10 depicts one embodiment of a pump-out valve manifold 158 for use in evacuating the cryostat chamber 90 through the pump-out port 134. The manifold 158 includes a body 160 having a generally circular head 162 which is adapted to be bolted, through holes 164, to the lower end wall of the detector housing 38. An annular groove 166 is formed in the head 162 for receiving an O-ring 168 to establish a tight seal with the end wall of the detector housing when the manifold 158 is secured thereto. It will be understood, of course, that the dust cover is removed from the valve assembly 136 when the manifold 158 is in place.

The manifold body 160 has a central bore 170 which communicates with one or more adaptors 172 for connection to the intake line of a vacuum pump. the central bore 170 also communicates with a reduced-diameter bore 174 in a necked-down portion 176 of the body 160. An elongate tool 178 extends axially through the bores 174 and 170 and terminates at its inner end in a head 180 having two spaced prongs 182 extending outwardly of the manifold body 160. If desired, the head 180 may be received within an enlarged portion 184 of the bore 170. A gland nut 186 threads on the necked-down portion 176 of the body 160 to establish a seal around the tool shaft. An O-ring 188 and compression washer 190 are provided for this purpose. Finally, a transverse handle 192 is attached to the outer end of the shaft of the tool 178.

In use, the manifold 158 is bolted to the lower end wall of the detector housing 38, as aforesaid, and the tool 178 is pushed inwardly until the prongs 182 fit within two of the holes 150 of the threaded disc 142 of the valve assembly 136. The tool 178 is then rotated to unthread the disc 142 and, by virtue of the transverse pin 148 in the valve stem 140, thereby withdraw the valve head 137 from sealing engagement with the pump-out port 134. The vacuum chamber 90 within the cryostat may thereupon be evacuated through the pump-out port 134 and valve manifold 158 to establish or restore the vacuum pressure to the desired level. Generally, a roughing-in pump or a diffusion pump, or both, may be used for this purpose. After the desired vacuum pressure is reached, the tool 178 is rotated in the reverse direction to thread the disc 142 back into the bore 144 so as to bring the valve head 137 back into sealing engagement with the pump-out port 134. Thereafter the tool 178 is withdrawn and the valve manifold 158 is unbolted and removed from the cryostat. The dust cover 156 is then replaced to prevent dust from entering the seal assembly 136. It will be understood that if only two holes 150 are provided in the disc 142, the tool 178 would be withdrawn before beginning evacuation of the chamber 90 to provide free communication through the holes 150 to the chamber 90. If more than two holes are provided, it would not be necessary to withdrawn the tool.

In order to minimize vacuum degradation, it is a feature of the invention that only metal-to-metal seals are used across the vacuum chamber 90. Hence, as described above, the Cajon connector 110 connecting the flexible stainless steel vacuum tube 106 to the cryostat head 32 is a copper vacuum seal connector and the valve member 138 in the lower vacuum seal assembly 136 is copper. To the same end, the seal between the lower head 37 of the cryostat and the end cap or detector housing 38 is a metal-to-metal seal. As shown in FIGS. 2 and 8, this seal includes a copper gasket 194 which is captured between concentric but slightly offset knife edges 196 and 198 formed on the facing surfaces of the cryostat lower head 37 and the end cap 38. Outgassing is further reduced, in accordance with the invention, by the use within the cryostat 18 and cryogen chamber 36 of only welded or silver-soldered connections and, where possible, performing the soldering in an inert atmosphere. If flux is used in the soldering process, it is preferably completely removed to prevent outgassing.

Figure 11:
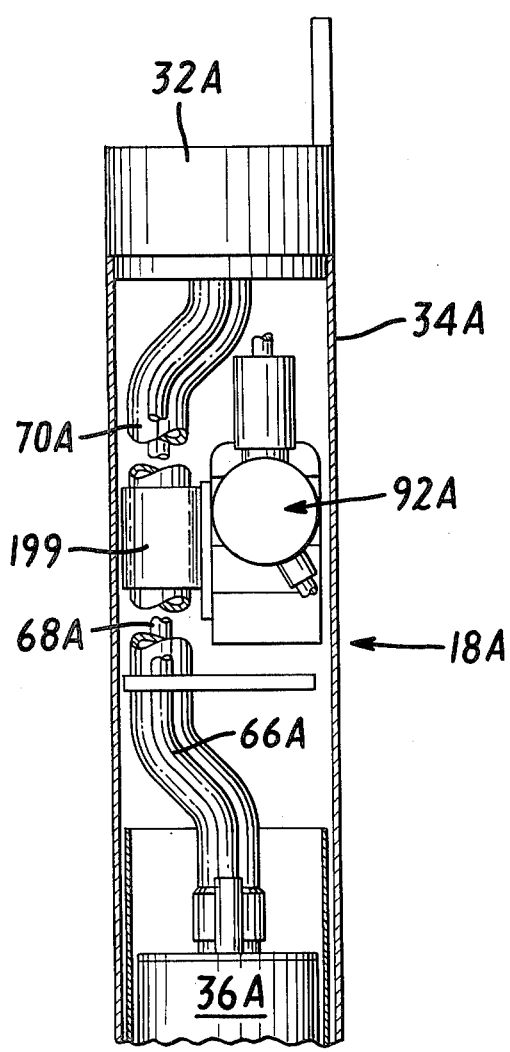
FIG. 11 is a partial vertical sectional view of another embodiment of the invention, showing the active vacuum pump mounted within the vacuum chamber of the cryostat.

In accordance with a further feature of the invention, the pumping efficiency can be further improved by mounting the ion pump 92 internally of the cryostat 18 or by providing a second cryostat for cooling the ion pump. The first of these embodiments is illustrated in FIG. 11, where the ion pump 92A is shown supported within the outer housing 34A of the cryostat 18A and supported therein between the head 32A and the cryogen chamber 36A by attachment, as by a clamp 199, to the center tube 70A. If desired, the center tube 70A and the fill and vent tubes 66A and 68A may be bent or otherwise axially offset to provide additional space for the ion pump 92A. The ion pump 92A may of course be connected directly to the cryogen chamber 36A, e.g. the upper end cap thereof, for cooling by the cryogen. For clarity of illustration in FIG. 11, the electrical and vacuum lines leading to the ion pump 92A, the cryogen chamber 36A, and the detector (not shown) have been omitted. Mounting of the ion pump within the cryostat eliminates outgassing problems associated with the rapid introduction of an externally mounted pump to high ambient temperatures. An internally mounted ion pump would therefore be especially advantageous for logging applications where very high borehole temperatures are known or are expected to exist.

Figure 12:
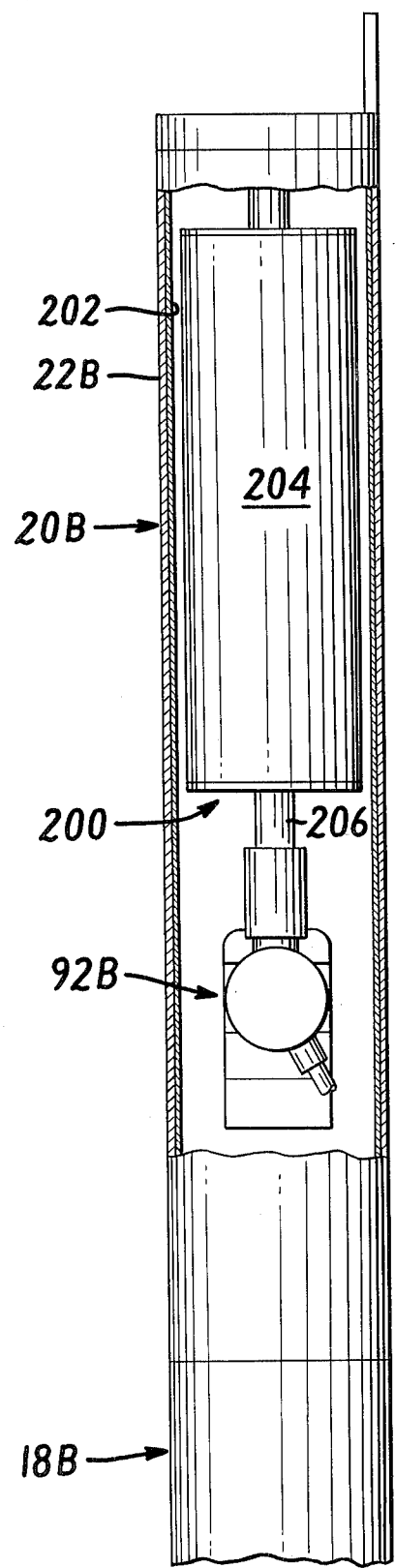
FIG. 12 is a partial vertical sectional view of still another embodiment of the invention, showing the active vacuum pump mounted within a second cryostat.

FIG. 12 illustrates a representative embodiment of the invention wherein the ion pump 92B is mounted externally of the cryostat 18B and is cooled by a second cryostat 200 located, for example, in the vacuum pump extension 20B. In FIG. 12, the pressure housing is indicated at 22B, the outer housing of the cryostat 200 at 202 and the cryogen chamber of the second cryostat at 204. The ion pump 92B may be mounted in any convenient way within the outer housing 202 of the second cryostat in good thermal contact with the cryogen chamber 204. It is shown in FIG. 12 as coupled by a cold finger 206 to the lower end cap of the cryogen chamber 204. Since the purpose of the cryostat 200 is to minimize the rate of temperature increase of the ion pump 92B, it need not cool the pump to the same temperature as the main cryostat 18B cools the detector. Accordingly, nearly any cryogenic material may be employed in the second cryostat, including for example, dry ice, water ice, and the like. As with FIG. 11, the electrical and vacuum connections have been omitted from FIG. 12 for ease and clarity of illustration.

Although the invention has been illustrated and described herein with reference to specific embodiments thereof, it will be understood that such embodiments are susceptible of modification and variation without departing from the inventive concepts embodied therein. For example, it will be appreciated that the invention has application to environments and uses, other than boreholes, where temperature and/or space limitations are crucial. All such modifications and variations, therefore, are intended to be encompassed within the spirit and scope of the appended claims.

I claim:

1. A borehole logging tool, comprising:
    an elongated logging tool housing sized for passage through a borehole;
    a cryostat located within the housing, said cryostat including means defining first and second chambers, said first chamber comprising a generally cylindrical cryogen chamber and forming a reservoir for a cryogenic material and said second chamber surrounding said first chamber and comprising a vacuum thermal insulation chamber;
    a semiconductor radiation detector located within said second chamber in thermal contact with said first chamber; and
    an active vacuum pump means mounted within said housing and coupled to said second chamber for continuously maintaining a vacuum therein over the holding time of said cryostat.

2. The tool of claim 1 wherein said active vacuum pump means comprises an ion pump.

3. The tool of claim 1 further comprising thermal radiation shield means located within said second chamber in surrounding relation to said first chamber.

4. The tool of claim 3 wherein said radiation shield means comprises:
    at least one generally cylindrical member having thermally reflective surfaces, said cylindrical member being telescoped over said first chamber and being of an axial length at least as great as that of said first chamber; and
    means supporting said cylindrical member within said second chamber in substantially thermally-conductive isolation from the facing walls of said first and second chambers.

5. The tool of claim 1 wherein said cryogenic material comprises a melting-solid cryogen.

6. The tool of claim 5 further comprising:
    a fill tube extending into said first chamber from the upper end thereof for introducing the cryogenic material into said first chamber as a liquid; and
    a vent tube extending into said first chamber from said upper end thereof for venting gas from said first chamber during the introduction of said cryogenic material, said vent tube extending into said first chamber a greater distance than said fill tube and defining between its inner end and said upper end of the first chamber an expansion volume for said cryogenic material.

7. The tool of claim 5 further comprising:
    means accessible from outside said cryostat when said tool is withdrawn from a borehole for introducing therein a freezing agent for freezing said cryogen, said means including a tubular member of thermally conductive material extending axially through an end wall of said cryostat and said first and second chambers; and
    a plurality of thermally conductive fins located within said first chamber in thermal contact with said tubular member and said cryogenic material, said fins being radially spaced about the circumference of said tubular member and extending lengthwise of said first chamber over at least that portion of the chamber to be occupied by the cryogenic material.

8. The tool of claim 1 further comprising thermal conductor means within said first chamber for promoting temperature uniformity within said chamber.

9. The tool of claim 8 wherein said thermal conductor means comprises a plurality of thermally conductive fins extending lengthwise of said first chamber over at least that portion of said first chamber occupied by the cryogenic material.

10. The tool of claim 1 wherein said active pump means is operable to maintain the pressure within said second chamber at $10^{-4}$ Torr. or less over at least a portion of the holding time of said cryostat.

11. The tool of claim 1 wherein the outer diameter of said housing is not more than 3 inches.

12. The tool of claim 1 wherein all seals established between the interior and exterior of said second chamber comprise metal-to-metal seals.

13. The tool of claim 1 wherein said active pump means is mounted externally of said first and second chambers.

14. The tool of claim 13 further comprising:
    means accessible from outside said cryostat when said tool is withdrawn from a borehole for introducing therein a freezing agent for freezing said cryogen, said means including a tubular member of thermally conductive material extending axially through an end wall of said cryostat and said first and second chambers; and
    means for mounting said active pump means axially adjacent said end wall of the cryostat such that said pump means may be displaced to permit said introduction of the freezing agent into the cryostat without disconnecting the vacuum coupling between said pump means and said second chamber.

15. The tool of claim 13 further comprising:
a second cryostat located within said housing and externally of said first cryostat, said second cryostat containing a cryogenic material; and
means establishing thermal contact between the cryogenic material in said second cryostat and said active pump means.

16. The tool of claim 1 wherein said active pump means is mounted within said second chamber; and
wherein said tool further comprises means establishing thermal contact between said active pump means and said cryogenic material.

17. The tool of claim 1 further comprising valve means in said cryostat for permitting attachment thereto of a second vacuum pump for establishing a desired vacuum pressure level within said second chamber.

18. A borehole logging tool comprising:
an elongated logging tool housing sized for passage through a borehole;
a cryogen chamber located within the housing;
a vacuum thermal insulation chamber surrounding the cryogen chamber;
a semiconductor radiation detector located within said vacuum chamber in thermal contact with said cryogen chamber; and
an active vacuum pump means mounted within said housing and coupled to the vacuum chamber for continuously maintaining a vacuum therein over the holding time of said cryogen chamber.

19. A cryostat for cooling a semiconductor radiation detector in a logging tool in a restricted space-high temperature environment, comprising:
an elongated cryostat housing having a comparatively small transverse cross-sectional size;
a cryogen chamber within the housing forming a reservoir for a cryogenic material;
a vacuum thermal insulation chamber within the housing surrounding the cryogen chamber;
a semiconductor radiation detector located within the vacuum chamber in thermal contact with the cryogen chamber; and
an active vacuum pump means mounted within said housing and coupled to the vacuum chamber for continuously maintaining a vacuum therein over the holding time of said cryostat.

20. The cryostat of claim 19 wherein said active vacuum pump means comprises an ion pump.

21. The cryostat of claim 19 further comprising thermal radiation shield means within the vacuum chamber in surrounding relation to the cryogen chamber.

22. The cryostat of claim 19 further comprising thermal conductor means within the cryogen chamber for promoting temperature uniformity within the cryogen chamber.

23. The cryostat of claim 19 wherein the active pump means is mounted within the vacuum chamber.

24. A cryostat, comprising:
means defining a cryogen chamber forming a reservoir for a cryogenic material;
means defining a vacuum thermal insulation chamber surrounding the cryogen chamber;
a fill tube extending into the cryogen chamber from one end thereof for introducing the cryogenic material into said chamber; and
a vent tube extending into the cryogen chamber from said one end thereof for venting gas from the cryogen chamber during the introduction therein of the cryogenic material, said vent tube extending into the cryogen chamber a greater distance than the fill tube and defining between its inner end and said one end of the cryogen chamber an expansion volume for the cryogenic material.

25. The cryostat of claim 24, further comprising a plurality of thermally conductive fins within the cryogen chamber and extending lengthwise thereof over at least that portion of said chamber occupied by the cryogenic material, whereby said fins promote temperature uniformity within the cryogen chamber.

26. The cryostat of claim 25 further comprising means for introducing an agent in said cryogen chamber for cooling the cryogenic material, said means including a tubular member of thermally conductive material extending axially through said one end of the cryogen chamber and wherein said plurality of thermally conductive fins are in thermal contact with said tubular member and are radially spaced about the circumference of said tubular member.

27. A borehole logging tool according to claim 1 or 18, wherein said cryostat is arranged between said detector and said pump within said elongated housing for protecting said detector from outgassing and other emissions from said pump.

* * * * *

UNITED STATES PATENT AND TRADEMARK OFFICE
CERTIFICATE OF CORRECTION

PATENT NO. : 4,241,592
DATED : December 30, 1980
INVENTOR(S) : Ralph M. Tapphorn It is certified that error appears in the above–identified patent and that said Letters Patent are hereby corrected as shown below:

First page, Item 56, 6th reference, "11/1969" should read -- 1/1969 --;

Column 2, line 20, insert a comma after "detector";

Column 2, line 23, "provides" should read -- provide --;

Column 3, line 60, "200°0 C." should read -- 200°C --;

Column 7, line 36, "head" should read -- lead --;

Column 8, line 31, "62" should read -- 52 --; and

Column 9, line 58, "the central" should read -- The central --.

Signed and Sealed this

Second Day of June 1981

[SEAL]

Attest:

RENE D. TEGTMEYER

Attesting Officer    Acting Commissioner of Patents and Trademarks